(12) United States Patent
Hesener

(10) Patent No.: US 7,250,896 B1
(45) Date of Patent: Jul. 31, 2007

(54) METHOD FOR PIPELINING ANALOG-TO-DIGITAL CONVERSION AND A PIPELINING ANALOG-TO-DIGITAL CONVERTER WITH SUCCESSIVE APPROXIMATION

(75) Inventor: Marc Hesener, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/445,429

(22) Filed: Jun. 1, 2006

(51) Int. Cl.
*H03M 1/34* (2006.01)

(52) U.S. Cl. .................. 341/163; 341/155; 341/144

(58) Field of Classification Search .......... 341/155, 341/163, 144, 161, 141
See application file for complete search history.

(56) References Cited

U.S. PATENT DOCUMENTS

| | | | | |
|---|---|---|---|---|
| 5,282,216 A | * | 1/1994 | Patel et al. | 369/59.22 |
| 5,724,394 A | * | 3/1998 | Ikeda et al. | 375/341 |
| 6,424,284 B1 | * | 7/2002 | Lopata et al. | 341/163 |
| 6,567,021 B1 | * | 5/2003 | Burns | 341/120 |
| 6,608,580 B2 | * | 8/2003 | Hsueh | 341/155 |
| 6,809,674 B1 | * | 10/2004 | Ramsden | 341/155 |
| 6,927,712 B2 | * | 8/2005 | Wei | 341/122 |
| 2005/0122247 A1 | * | 6/2005 | Hammerschmidt et al. | 341/163 |

OTHER PUBLICATIONS

"A 1.2V 10b 20MSample/s Non-Binary Successive Approximation ADC in 0.13µm CMOS", Franz Kuttner, ISSCC Digest of Technical Papers, vol. 45, pp. 176-177, 2002.

* cited by examiner

*Primary Examiner*—Peguy JeanPierre
(74) *Attorney, Agent, or Firm*—Eschweiler & Associates, LLC

(57) ABSTRACT

A method for pipelining an analog-to-digital conversion of an analog input signal into an N-bit digital output signal is disclosed where a multiplexer is used for the selection of pre-processed digital approximation values from a plurality of adders and subtractors. The selection is set after the decoding of the selected digital approximation values. Thus, considerable more time of the total iteration cycle is available for the pre-amplifier to settle at very high operation frequencies.

20 Claims, 5 Drawing Sheets

Time budget example

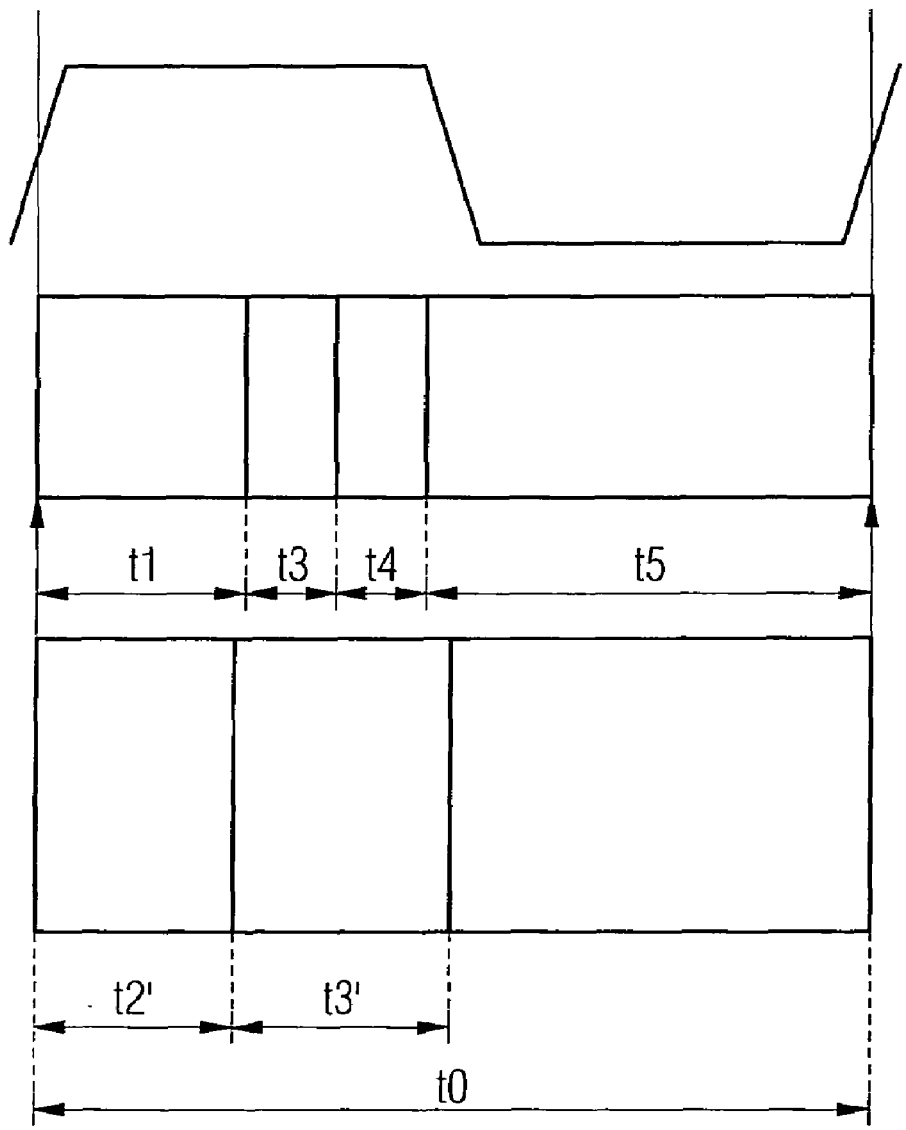

US 7,250,896 B1

METHOD FOR PIPELINING ANALOG-TO-DIGITAL CONVERSION AND A PIPELINING ANALOG-TO-DIGITAL CONVERTER WITH SUCCESSIVE APPROXIMATION

FIELD OF THE INVENTION

The invention is related to electronic circuits, and more particularly is related to analog-to-digital conversion circuits and associated methods using successive approximation.

BACKGROUND OF THE INVENTION

Analog to digital converters (ADC) provide the interface between the analog world and digital systems. While digital signal processing becomes increasingly popular, many traditional analog functional blocks have been replaced by digital blocks. Due to extensive use of analog and mixed analog digital circuitry, ADC often appear to be the bottleneck in signal processing operations. Various types of ADCs exist, such as delta sigma modulator ADCs or successive approximation register (SAR) ADCs.

In the successive approximation method, the data bits of the digital output signal are successively determined one after the other in a successive approximation step. Generally, the analog-to-digital converter is provided with a comparator, a digital-to-analog converter (DAC), a successive approximation register (SAR), and a logic circuit. The successive approximation method first involves setting the most significant bit (MSB) and then using the digital analog converter (DAC) to ascertain the associated value of an analog voltage. If the input analog voltage to be converted is higher than the ascertained output analog voltage of the digital analog converter (DAC), then the set-bit remains set and, in the converse case, it is reset. The next less significant bit is then set and the digital analog converter (DAC) is used to generate the associated analog output voltage from the corresponding digital value. The analog output voltage formed is then compared with the analog input voltage that is to be converted, and the comparator is used to decide whether or not the set-bit can remain set. The method is continued in this manner until all the bits of the binary coded digital analog converter have been ascertained successively.

The speed of the DAC and the comparator limits the conversion time of a successive approximation ADC. For example, an n-bit ADC must take n decisions for every conversion, and every decision must be as accurate as the final result of the conversion. The time for the comparator decision depends on the voltage step at the beginning of the comparison time. The recovery time increases for large voltage jumps. Therefore, if the design is changed so that the result is insensitive to small errors in the decisions with the highest voltage jumps, the conversion time can be improved. This leads to analog-to-digital converters with redundant codes.

Analog-to-digital converters with redundancy use codes with bases smaller than 2 (non binary). There are several digital codes for every input voltage, so small errors do not affect the conversion result. A DAC with a non-binary network is normally the key element of such an ADC. However, the major drawback of a non-binary DAC is poor matching and thus, minor linearity. The solution is to use the ubiquitous thermometer coded DAC which is fed by redundant preprocessed data. In such non-binary successive approximation analog-to-digital conversions, adding and subtracting operations are essential for processing the binary digits.

Therefore, at very high ADC frequencies (e.g. 430 MHz), it would not be feasible to start the adding and subtracting operation of a typical SAR ADC after the decision of a comparator. For example, a 14 bit addition needs about 1.3 ns in a 0.13 µm CMOS process.

An example of such a SAR ADC is illustrated in prior art FIG. 1, comprising a read-only-memory (ROM) 1, adding and subtracting means 3, a bus 5 and a decoder 7, a digital-to-analog matrix 9, a comparator 11, a pre-amplifier 13, a latch 15, a sample-&-hold block 17 and two registers 19 and 21.

Prior art FIG. 2 illustrates a SAR ADC comprising a ROM 23, an adder 25 and a subtractor 27 connected to a multiplexer 29 pre-processing the digital approximation values of which one is selected by a comparator 31 via the multiplexer 29. This parallel generation of digital values through an adder 25 and a subtractor 27 is known as 2-stage pipelining. The 2-stage pipelining SAR ADC illustrated in FIG. 2 further comprises a bus system 33, a decoder 35, a digital-to-analog matrix 37, a pre-amplifier 39, a latch 41, a sample-&-hold block 43 and a data register 45.

However, a time budget example for the operating sequence of the 2-stage pipelining SAR ADC (prior art FIG. 3) shows that the pre-amplifier is left with a time period of only t5=0.36 ns at an operation frequency of 35 MHz and a bit-length of n=12. Here, t5 is determined by subtracting the time needed for each part from the total time needed for the iteration cycle, e.g. t0=2.36 ns (iteration cycle), t1=0.7 ns (latch+driver), t2=0.3 ns (MUX+bus), t3=0.7 ns (decoder+driver) and t4=0.3 ns (DAC matrix), resulting in the time available for the Pre-amplifier to settle of t5=t0−t1−t2−t3−t4=0.36 ns.

For example, at a required amplification in the range of 200 the pre-amplifier would need at least double that time. In other words, the SAR ADC displayed in prior art FIG. 2 could not operate at the frequency suggested in the above example.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

Accordingly, the present invention is directed to a method for analog-to-digital conversion of an analog input signal into a digital output signal that can operate at very high frequencies (e.g. 430 MHz) without showing any of the disadvantages mentioned above with respect to the prior art.

The invention is also directed to a successive approximation analog-to-digital converter that does not show any of the disadvantages mentioned with respect to the prior art when operating at very high frequencies (e.g. 430 MHz).

In one embodiment of the invention, a method for pipelining an analog-to-digital conversion of an analog input signal into an n-bit digital output signal comprises generating digital approximation values through a plurality of adders and subtractors. The method further comprises pre-selecting at least one digital approximation value from the plurality of adders and at least one digital approximation value from the plurality of subtractors by means of a first and second multiplexer according to a comparator decision.

The method further comprises decoding at least one of the digital approximation values from the plurality of adders and at least one of the digital approximation values from the plurality of subtractors in parallel by means of a first and second decoder. At least one decoded digital approximation value of the first and second decoder is selected by means of at least a third multiplexer according to the comparator decision. The selected decoded digital approximation value is then converted into an analog approximation value by means of a digital-to-analog converter matrix.

Furthermore, in another embodiment the method comprises comparing the analog approximation value to an analog input signal by means of a comparator, and providing a comparator output value that is fed into a pre-amplifier and a latch. A latch output is generated according to the comparator decision, and the output is looped back into the first, second and third multiplexer. The digital approximation value is stored in a data register according to the comparator decision, wherein the third multiplexer, used for the selection of the digital approximation value of the plurality of adders and subtractors, is set after the first and second decoder.

In another embodiment of the invention, a pipelining analog-to-digital converter for converting an analog signal into an n-bit digital signal is disclosed. The converter comprises a plurality of adders and subtractors, a first and second multiplexer, a first and second decoder, an n-bit bus system between the first decoder and the first multiplexer, and an n-bit bus system between the second decoder and the second multiplexer. The converter further comprises a third multiplexer, a digital-to-analog converter matrix, a comparator, a pre-amplifier and a latch, a sample-&-hold block and a data register, wherein the third multiplexer is set after the first and second decoder.

One feature of the invention is that the decision of the third multiplexer, selecting either an increased or decreased digital approximation value, is set after the decoding stage in order to avoid an additional delay caused by the bus system and the decoder. Therefore, considerable more time from the whole iteration cycle is left for the pre-amplifier to settle, even at high frequencies.

In one embodiment, the analog to digital converter is an n-stage pipelining analog-to-digital converter, wherein n is greater or equal than three. The at least three stages ensure that the bus system and the decoder can be taken out of the so called 'critical path', thereby avoiding the additional delay and giving more time to the pre-amplifier to settle.

Furthermore, in another embodiment the plurality of adders and subtractors are coupled to a read only memory (ROM) comprising bit weights for the plurality of adders and subtractors according to an error tolerance, thereby allowing the multiplexer to change the digital approximation values during the comparison cycle, in case the comparator result is not valid.

Moreover, in another embodiment the digital approximation values are transferred to the plurality of decoders by means of a plurality of n-bit bus systems. This allows a fast transfer of the n-bit digital approximation values of the adders, and in parallel, of the subtractors.

In still another embodiment, the first and second decoders convert at least one of the digital approximation values of the plurality of adders and at least one of the digital approximation values of the plurality of subtractors into a thermometer code driving the digital analog converter matrix.

Moreover, in one example the latch output is a 1-bit latch output value. Furthermore, in one example the data register comprises the register of the first and second decoder, the third multiplexer and a register coupled to the first and second multiplexer and the comparator, to allow a buffering for the preprocessed digital approximation values at high frequencies.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 is a timing diagram illustrating a time budget example for an operating sequence of a 3-stage pipelining successive approximation register analog-to-digital converter according to the invention.

DETAILED DESCRIPTION OF THE INVENTION

It is to be noted that although the present invention is described with reference to the preferred embodiment as illustrated in the following detailed description and in the accompanying drawings, the detailed description, as well as the drawings, are not intended to limit the present invention to the particular embodiments disclosed therein, but rather, the described embodiments merely exemplify the various aspects of the present invention, the scope of which is defined by the appended claims.

Figure 1:
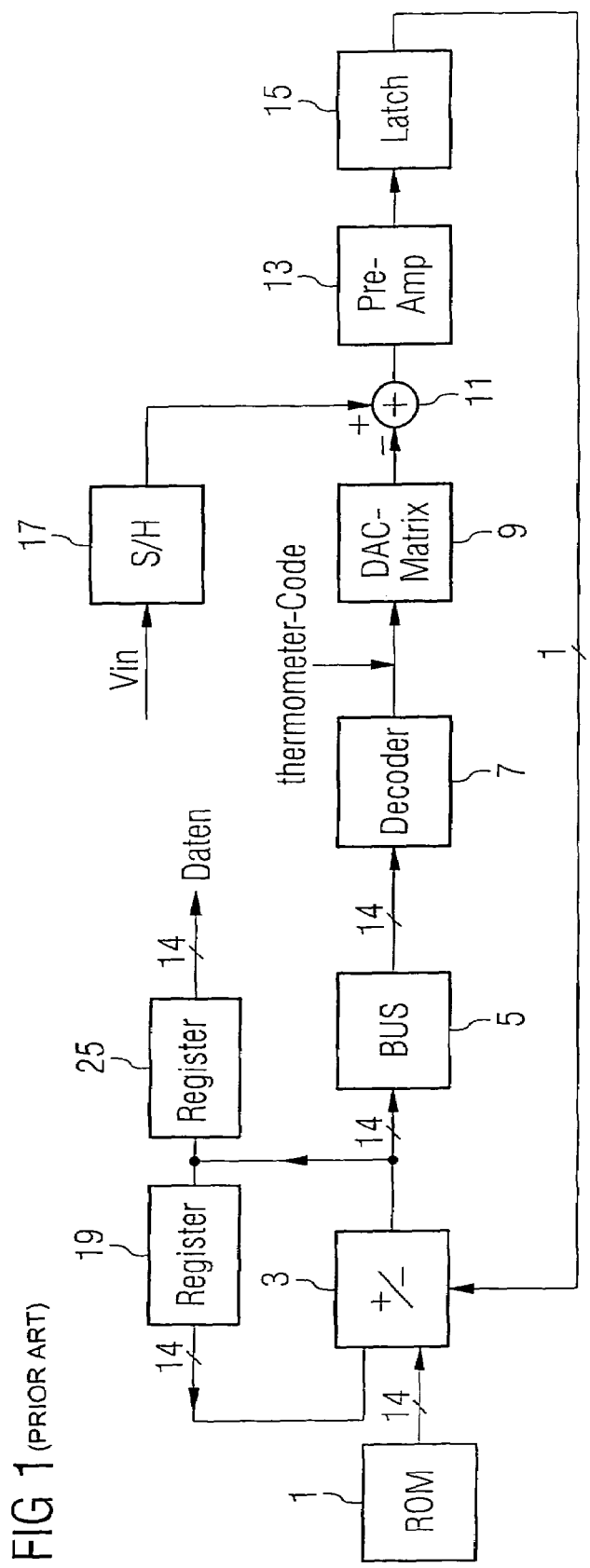
FIG. 1 illustrates schematically a prior art successive approximation register analog to digital converter.
Figure 2:
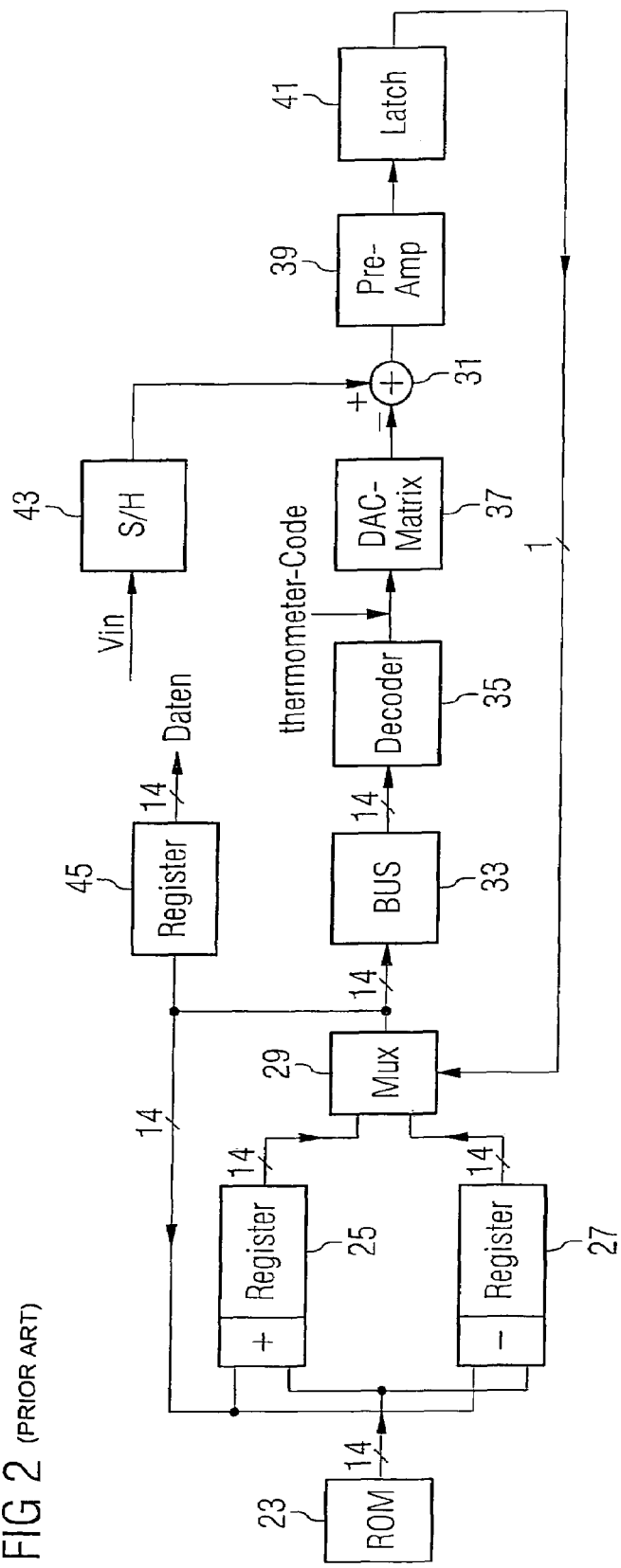
FIG. 2 illustrates schematically a prior art 2-stage pipelining successive approximation register analog-to-digital converter.
Figure 3:
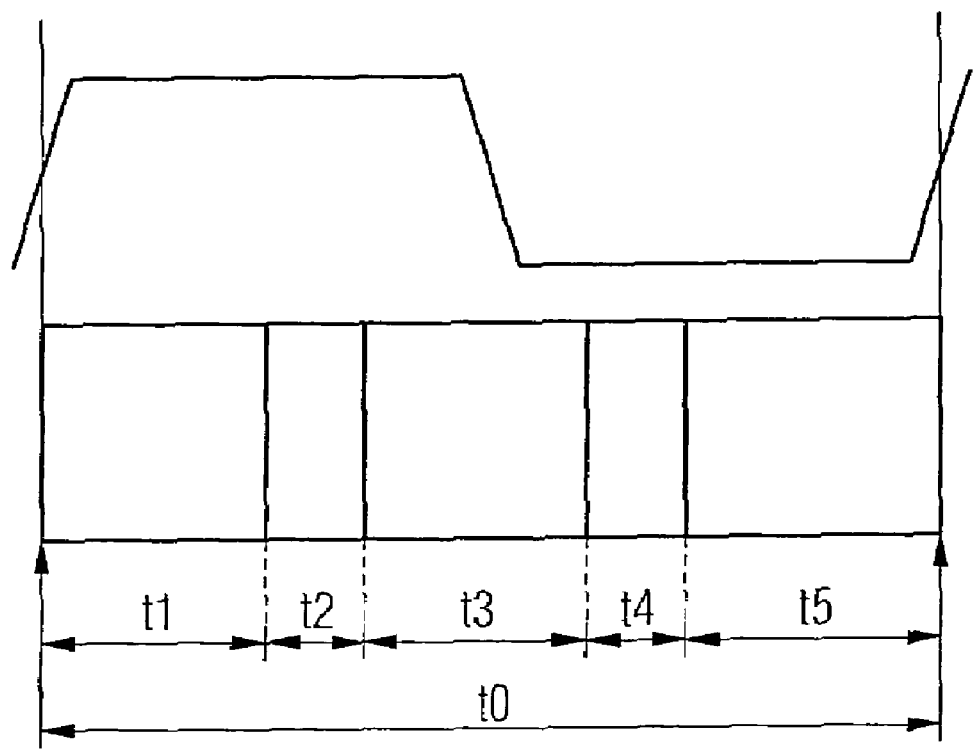
FIG. 3 is a timing diagram illustrating a time budget example for the operating sequence of a prior art 2-stage pipelining successive approximation register analog-to-digital converter.
Figure 4:
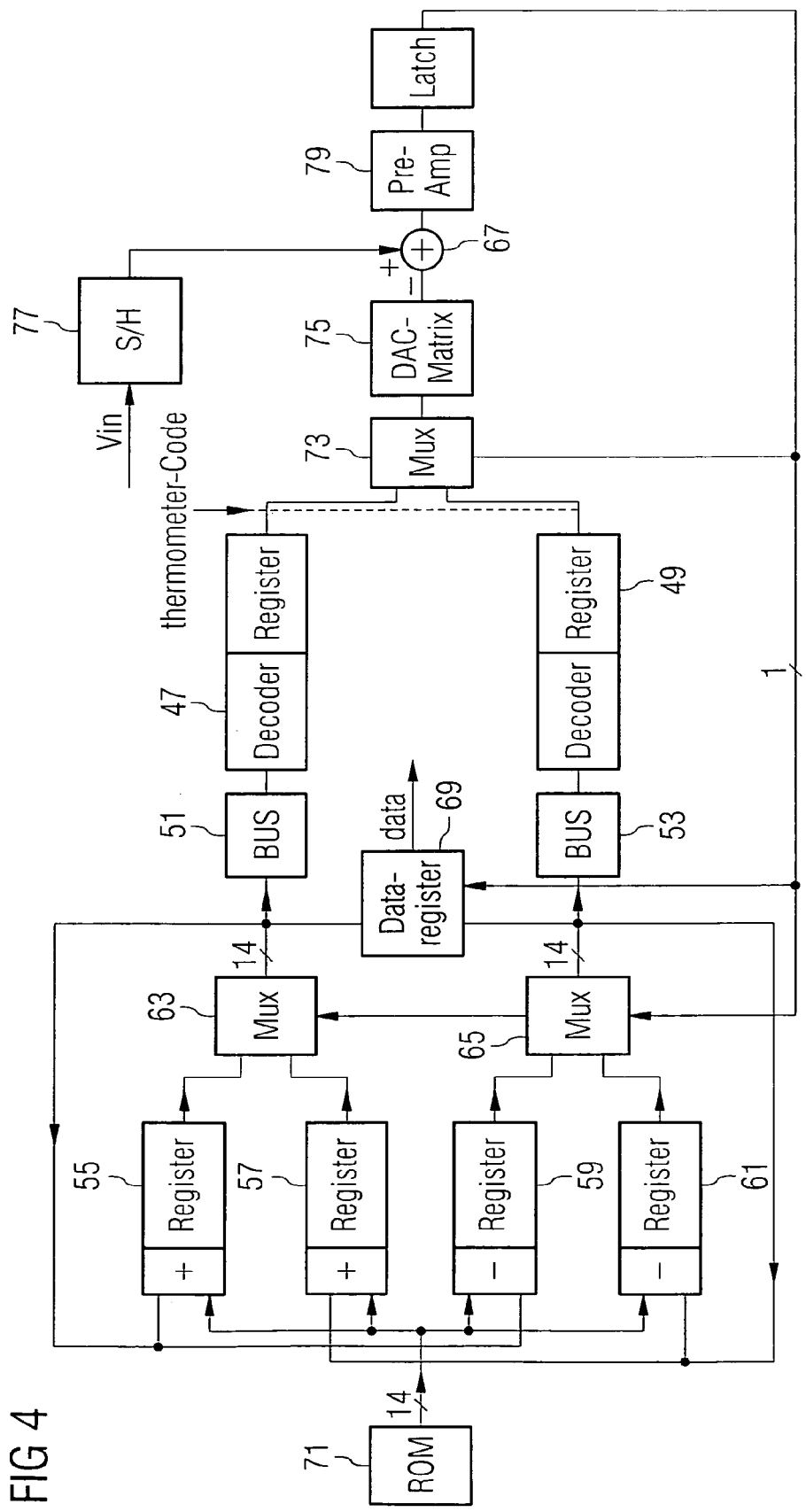
FIG. 4 is a schematic block diagram illustrating a method of pipelining analog-to-digital conversion of an analog input signal according to an embodiment of the invention.

FIG. 4 illustrates a system and method of pipelining an analog-to-digital conversion of an analog input signal into, for example, a 14-bit digital output signal.

In order to allow the selection of the appropriate digital approximation value to be set after the decoding stage, the decoder in one embodiment is split-up into two parallel decoders 47 and 49, and two bus-systems 51 and 53, respectively. The first decoder 47 decodes the selected digital approximation value provided by one of the two adders 55 and 57 and a second decoder 49 decodes the selected digital approximation value provided by one of the two subtractors 59 and 61. Therefore, four intermediate results for the possible digital approximation value are provided by the two adders 55, 57 and the two subtractors 59, 61, and two of the four possible digital approximation values are pre-selected, respectively, by a first multiplexer 63 and a second multiplexer 65 according to a previous comparator 67 decision and the selected two digital approximation values are temporarily stored in a data register 69.

Thus, the two parallel decoders 47 and 49 always decode digital approximation values that are intended for the following comparison cycle.

If, for example, an analog signal $V_{in}$ is converted into a digital signal that is supposed be an accurate representation of the analog signal $V_{in}$, bit-weights stored in a ROM 71 are used to calculate the values of the first set of digital approximation values provided by the two adders 55 and 57 and the two subtractors 59 and 61.

From the four different approximation values, one of the two digital approximation values provided by the two adders 55 and 57, and one of the two digital approximation values provided by the two subtractors 59 and 61, is selected by the first multiplexer 63 and the second multiplexer 65, respectively. The two digital approximation values are transferred to a first decoder 47 and a second decoder 49, respectively, by a first bus 51 and a second bus 53 and are decoded into a thermometer code. A third multiplexer 73 selects one of the remaining two digital approximation values decoded by the first decoder 47 and the second decoder 49 according to a comparator 67 decision choosing either the higher or lower digital approximation value compared with the digital approximation value of the previous cycle.

The selected digital approximation value is then converted into an analog signal by a digital-to-analog converter (DAC) matrix 75 and compared to the analog signal $V_{in}$ that was temporarily stored in a sample-&-hold block 77. The output of the comparator 67 is then fed into a pre-amplifier 79 and a latch 81, generating a 1-bit latch-output according to the comparator 67 decision (either 0 or 1). Then, the 1-bit latch output is looped back to first 63, second 65 and third 73 multiplexers and to the data register 69 storing the two pre-selected digital approximation values.

Depending on the comparator decision, one of the two pre-selected digital approximation values is deleted. This cycle is repeated until the digital approximation value has an accuracy of at least ½ LSB compared with the analog signal $V_{in}$ or is stopped earlier, depending on the requested accuracy.

A numerical time budget example at a frequency of 35 MHz and a bit size of n=12, with t0=2.36 ns (iteration cycle), t1=0.7 ns (latch+driver), t3=0.3 ns (MUX+driver) and t4=0.3 ns (DAC matrix), results in a settling time that is available for the pre-amplifier 79 of t5=t0-t1-t3-t4=1.06 ns, which is a much more realistic time period for the pre-amplifier 79 at very high frequencies (FIG. 5).

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A method for pipelining an analog-to-digital conversion of an analog input signal into an N-bit digital output signal, where N is a positive integer, comprising:
    generating digital approximation values through a plurality of adders and subtractors;
    pre-selecting a digital approximation value of the plurality of adders and a digital approximation value of the plurality of subtractors according to a comparison result;
    decoding the pre-selected digital approximation values;
    selecting one of the pre-selected decoded digital approximation values according to the comparison result, and converting the selected decoded digital approximation value into an analog approximation value;
    comparing the analog approximation value to an analog input signal, thereby providing a next comparison result, wherein the next comparison result is made available for a next pre-selecting and selection operations; and
    storing the value associated with the comparison result into a data register, wherein the selection of the decoded digital approximation values is performed after the decoding of the pre-selected digital approximation values.

2. The method of claim 1, wherein the plurality of adders and subtractors are coupled to a read-only-memory comprising bit-weights, wherein the read-only-memory is configured to facilitate a change in the generation of the digital approximation values according to an error tolerance.

3. The method of claim 1, wherein the pre-selected digital approximation values are transferred to a plurality of decoders for decoding thereof by means of a plurality of N-bit bus-systems.

4. The method of claim 1, further comprising converting the pre-selected digital approximation values into coded pre-selected digital approximation values using a thermometer code.

5. The method of claim 1, wherein the comparison result comprises a 1-bit latch output value.

6. The method of claim 5, wherein the 1-bit latch output value comprises a most significant bit of the N-bit digital output signal.

7. The method of claim 6, further comprising repeating the generation of digital approximation values, pre-selecting the digital approximation values, decoding the pre-selected digital approximation values, selecting one the pre-selected decoded digital approximation values, comparing and storing, wherein each stored value comprises a next bit of the N-bit digital output signal.

8. A pipelining analog-to-digital converter configured to convert an analog signal into an N-bit digital signal, comprising:
    a plurality of adders and subtractors, wherein each comprise a register for storing digital values, and configured to generate digital approximation values;
    a first and second multiplexer, configured to pre-select one digital approximation value from the adders and one digital approximation value from the subtractors according to a comparator decision;

a first and second decoder, each comprising a register configured to store digital values, and configured to decode the pre-selected digital approximation values in parallel with one another;

an N-bit bus-system coupled between the first decoder and the first multiplexer and an N-bit bus-system coupled between the second decoder and the second multiplexer;

a third multiplexer configured to select one of the decoded digital approximation values according to the comparator decision;

a digital-to-analog converter configured to convert the selected decoded digital approximation value to an analog approximation value;

a comparator configured to receive and compare the analog approximation value to the analog input signal and provide a comparator output value comprising the comparator decision;

a pre-amplifier and a latch configured to receive the comparator output value and generate a latch-output according to the comparator decision, wherein the latch-output is looped back into the first, second and third multiplexer; and a data register configured to store the comparator decision;

wherein, the third multiplexer is activated to select after the first and second decoder decode the pre-selected digital approximation values.

9. The pipelining analog-to-digital converter of claim 8, further comprising a read-only-memory, coupled to the plurality of adders and subtractors, configured to store bit-weights and provide the bit-weights to the plurality of adders and subtractors.

10. The pipelining analog-to-digital converter of claim 8, wherein the analog-to-digital converter comprises an n-stage pipeline analog-to-digital converter, wherein n is greater than or equal to three.

11. The pipelining analog-to-digital converter of claim 8, wherein a first stage comprises the plurality of adders and subtractors and the first and second multiplexers, wherein each is coupled to either the adders or the subtractors, respectively.

12. The pipelining analog-to-digital converter of claim 11, wherein a second stage comprises the parallel first and second decoders and the parallel N-bit bus-system.

13. The pipelining analog-to-digital converter of claim 12, wherein a third stage comprises the third multiplexer, the digital-to-analog converter, the comparator, the preamplifier and the latch.

14. The pipelining analog-to-digital converter of claim 8, wherein the first and second decoders convert the digital approximation values into a respective thermometer code.

15. The pipelining analog-to-digital converter of claim 8, wherein the latch-output comprises a 1-bit latch-output value.

16. The pipelining analog-to-digital converter of claim 8, wherein the plurality of adders comprises two adders and the plurality of subtractors comprises two subtractors.

17. A successive approximation analog-to-digital converter, comprising:

a first pipeline path comprising a first multiplexer configured to pre-select one of a plurality of additive digital approximation values, and a first decoder configured to decode the pre-selected additive approximation value, wherein the pre-selection is based on a comparison result;

a second pipeline path comprising a second multiplexer configured to pre-select one of a plurality of subtractive digital approximation values, and a second decoder configured to decode the pre-selected subtractive digital approximation value, wherein the pre-selection is based on the comparison result;

a third multiplexer configured to select one of the decoded pre-selected digital approximation values based on the comparison result, thereby outputting the selected digital approximation value;

a digital-to-analog converter configured to convert the selected digital approximation value to an analog approximation value; and a comparison circuit configured to compare an analog input signal and the analog approximation value and output the comparison result in response thereto.

18. The converter of claim 17, further comprising a preamplifier and a latch, wherein the preamplifier is configured to amplify the comparison result, and wherein the latch is configured to latch the amplified comparison result as a 1-bit output value.

19. The converter of claim 17, further comprising a read-only-memory operably coupled to the first and second pipeline paths, and configured to store bit-weights therein and selectively provide the bit-weights to the first and second pipeline paths according to an error tolerance of the converter.

20. The converter of claim 17, wherein the first and second pipeline paths operate in parallel with one another.

* * * * *